United States Patent [19]
Kaufman et al.

[11] Patent Number: 5,317,297
[45] Date of Patent: May 31, 1994

[54] MRI MAGNET WITH ROBUST LAMINATED MAGNETIC CIRCUIT MEMBER AND METHOD OF MAKING SAME

[75] Inventors: Leon Kaufman, San Francisco; Joseph W. Carlson, Kensington, both of Calif.; Shigemasu Okada, Osaka; Shigeo Hashimoto, Hyogo, both of Japan

[73] Assignee: The Regents of the University of California, Oakland, Calif.

[21] Appl. No.: 141,701

[22] Filed: Oct. 26, 1993

Related U.S. Application Data

[63] Continuation of Ser. No. 546,112, Jul. 2, 1990, abandoned.

[51] Int. Cl.$^5$ ............................................. H01F 3/00
[52] U.S. Cl. ..................................................... 335/297
[58] Field of Search ........................... 335/296–301, 335/281; 336/219, 234; 29/609; 428/621–626, 631

[56] References Cited

U.S. PATENT DOCUMENTS 4,990,879  2/1991  Aubert ........................... 335/306

FOREIGN PATENT DOCUMENTS 0170318  2/1986  European Pat. Off. .

Primary Examiner—Leo P. Picard
Assistant Examiner—Raymond Barrera
Attorney, Agent, or Firm—Nixon & Vanderhye

[57] ABSTRACT

An MRI magnet member (e.g., a pole piece or tip) is laminated using relatively large bar-shaped laminations instead of the usual thin sheet material. One or more layers of such bar-shaped laminations are arrayed with small insulating gaps into which a low loss insulating liquid filler material is flowed and then cured to a hardened solid state. This simultaneously produces insulated pole tip laminations which have been robustly integrated together into a unitary structure. The resulting robust laminated pole tip is relatively easy to manufacture and is also capable of withstanding rather large magnetic forces and maintaining relatively uniform magnetic field distribution within an MRI imaging region while yet providing providing sufficient eddy current reduction so as to efficiently permit rapidly changing magnetic gradient coil currents to be established.

60 Claims, 4 Drawing Sheets

MRI MAGNET WITH ROBUST LAMINATED MAGNETIC CIRCUIT MEMBER AND METHOD OF MAKING SAME

This is a continuation of application Ser. No. 07/546,112, filed Jul. 2, 1990, now abandoned.

This invention relate generally to magnet structures used to generate relatively high strength homogeneous magnetic fields within the image region of a magnetic resonance imaging (MRI) system. More particularly, this invention is directed to a robust laminated magnetic circuit member construction for an MRI magnet and to a method of manufacturing same.

Commercial MRI systems are now commonplace. In all such presently available commercial systems, a relatively large (e.g., 0.05 Tesla to 2.0 Tesla) substantially homogeneous nominally static magnetic field $B_o$ must be provided within the region to be imaged. Although some magnet designs (e.g., cryogenic) involve solenoidal electromagnets, others use permanent magnets and/or resistive electromagnets in conjunction with magnetic circuit yokes and suitably shaped pole pieces disposed on opposite sides of the image region.

As a part of typical MRI processes, it is also necessary to mount electromagnet gradient coils in close proximity to metallic members associated with the static magnet structure (e.g., a shaped pole piece). When proper electrical currents are passed through these gradient coils, then the nominally static homogeneous field in the image region can be temporarily altered so as to produce a controlled gradient in any desired direction (e.g., along x,y,z coordinate directions). Typical MRI procedures require rapidly changing sequences of carefully controlled magnetic gradient fields. The rapidity with which a desired magnetic gradient can be established directly affects the overall time required to generate and capture necessary MRI imaging data.

The time required for a complete MRI imaging process is, of course, directly related to the overall efficiency of MRI system usage. Since typical MRI installations are quite costly, efficient usage is very important from even a purely economic point of view.

Furthermore, if excessive time is required for a complete MRI imaging procedure, then some patients will find it difficult, if not impossible, to remain relatively motionless in a relatively confined space for such prolonged periods of time. This problem is further compounded where the patient may be in various sorts of medical distress during the imaging procedure.

As briefly mentioned above, it has already been recognized that eddy currents generated in nearby electrically conductive portions of the main MRI magnet can cause undesirable lengthening of an overall imaging procedure. In particular, due to the laws of physics, any generated eddy current itself generates a magnetic field which is oriented opposite to the changing magnetic field which generated the eddy current in the first place. Thus, in order to achieve a predetermined gradient field, one has to take into account the opposing fields which will be inherently generated by induced eddy currents. Thus, extra gradient coil current must be forced into the coil (representing further expense) and/or one must wait for initial eddy current effects to dissipate before the desired predetermined gradient field can be realized (representing undue lengthening of the MRI process). One measure of this time parameter is the elapsed time required to establish 90% of a given desired predetermined final gradient field.

Of course the use of electrically insulated magnetically permeable laminations has been used for many years to reduce eddy current losses in power transformers and the like (which are also subjected to changing magnetic flux fields). Magnetic structures located proximate pulsed coils in other endeavors (e.g., particle accelerators) have also long been laminated to reduce adverse eddy current effects.

Accordingly, it is perhaps not surprising that others have also proposed the general idea of using insulated magnetically permeable laminations in the pole tips of MRI magnets so as to reduce adverse eddy currents effects. For example, applicants are at this time aware of the following prior proposals:

Published Japanese Patent Application No. 61-203,605 (Ono, published Sep. 9, 1986).

Published Japanese Patent Application No. 63-105,745 (Furukawa, published May 11, 1988).

Published Japanese Patent Application No. 63-143,045 (Iinuma et al, published Jun. 15, 1988).

Although these prior approaches appear to be concerned with improving the uniformity or homogeneity of magnetic fields within the image region, they also appear to recognize some of the adverse eddy current effects and propose insulated laminations in the pole tip or pole piece to minimize such adverse eddy current effects. However, the Ono reference explicitly teaches the use of traditional "thin sheets" for the laminations. Since the other references either use similar descriptions or are silent about dimensions of the laminations, presumably they also use the traditional thin sheets. Nor do the references teach any details as to how a laminated structure might be made sufficiently robust to withstand the rather strong magnetic forces encountered in typical MRI magnet applications—nor how to realize such laminated structures in a convenient manufacturing method.

In consultations with those skilled in art of designing pulsed magnets for particle accelerators, some of the applicants were told that the largest permissible lamination thickness would be on the order of 0.030 inch (about 0.7 millimeter). Since the usual diameter of an MRI static magnet pole is on the order of 1 to 1.5 meters, it can readily be seen that, even at this supposedly "maximum" lamination thickness, the number of required laminations would be quite high (e.g., on the order of more than 1500 to 2,500). Furthermore, with such a large number of laminations and the requirement for insulation between each of them, the overall effective magnetic permeability of the pole piece will necessarily suffer (e.g., the "fill-factor" of magnetic circuit material will suffer as compared to a completely solid metal one-piece construction).

Others in the prior art also have attempted to minimize the problem of eddy currents by forming at least part of the MRI magnet pole piece from powdered magnetically permeable material bonded with an electrically insulating binder. One example is:

Published Japanese Application No. 63-25,907 (Inomata et al, published Feb. 3, 1988) and apparently a counterpart to U.S. Pat. No. 4,827,235 issued May 2, 1989.

For various reasons of economy, performance and ease of manufacture, this powdered construction approach also has its disadvantages.

In brief summary, contrary to the apparent conventional wisdom, we have discovered that, at least in the MRI magnet context, effective eddy current suppression can be achieved with extremely wide laminations (e.g., greatly in excess of 0.030 inch or 0.7 millimeter). We have discovered that the limitation on 90% response time caused by eddy currents in MRI magnets is related to lamination width. In particular, for 90% response times on the order of 0.5 millisecond (typically representing sufficient eddy current suppression for MRI applications), laminations on the order of as much as 1 centimeter thick still may be quite effective.

Since manufacturing cost and complexity is typically inversely related to lamination width, we have also discovered a particularly cost efficient way to manufacture laminated MRI magnet pole tips.

Furthermore, the robustness of the resulting laminated magnetic circuit member (e.g., a pole piece or pole tip) is particularly good since all of the laminated pieces are individually already robust (e.g., relatively large bar-shaped pieces). In an MRI magnet environment where quite high magnetic forces may be experienced (which may change during an imaging procedure due to changing gradient fields and the like), strong stable and robust mechanical members are also highly desirable.

Since individual laminations can be quite wide, it follows that the effective "fill factor" for magnetically permeable material can also be quite high. Thus, overall magnetic performance can be substantially maintained while yet introducing just sufficient lamination so as to just sufficiently control adverse eddy current effects.

The overall result is a more nearly optimum MRI magnet structure having a structure which more nearly provides optimum magnetic as well as electrical and mechanical characteristics.

In the preferred exemplary embodiment, two such laminated layers are utilized in each pole piece or pole tip and are oriented at mutually orthogonal angles. At least some of the bar-shaped laminations are prepared by application of short lengths of adhesive insulating tape before being arranged in layers within a circular frame member. The insulating tapes serve to automatically space the bar members from one another and from the frame member during this assembly process. A curable liquid state insulating filler (e.g., a synthetic resin such as epoxy and a bonding agent) is then flowed over the assembled and spaced-apart bar laminations so as to thoroughly fill all of the interstices within that arrayed structure. The filler material thereafter is cured and hardened to a solid state so as to bind the entire multi-layer laminated bar structure into one mechanically robust pole piece structure.

To facilitate the manufacturing process, the circular frame member may include an L-shaped lower member into which notched ends of some of the bar elements may be laid. Spaced apart mounting blocks may also be included within this lower circular frame so as to facilitate the mounting of an upper-most shaped circular frame member. The two circular frame members may then be clamped together with suitable electrically isolated threaded bolts or the like. Of course, the curable liquid binder may also be used to help effect connection of the bar lamination ends within the circular frame members.

To help prevent undesirable eddy currents in the circular frame members, there is also at least one radially extending break in electrical continuity about the circumference of at least one of the circular frame members.

These and well as other objects and advantages of this invention will be more completely understood and appreciated by carefully studying the following detailed description of presently preferred exemplary embodiments taken in conjunction with the accompanying drawings, of which:

FIG. 7 is a cross-sectional depiction of the FIG. 5 embodiment at a first stage in an exemplary method of manufacture;

FIG. 8 is a cross-sectional depiction of the FIG. 5 embodiment at a later stage in the same exemplary method of manufacture.

Figure 1:
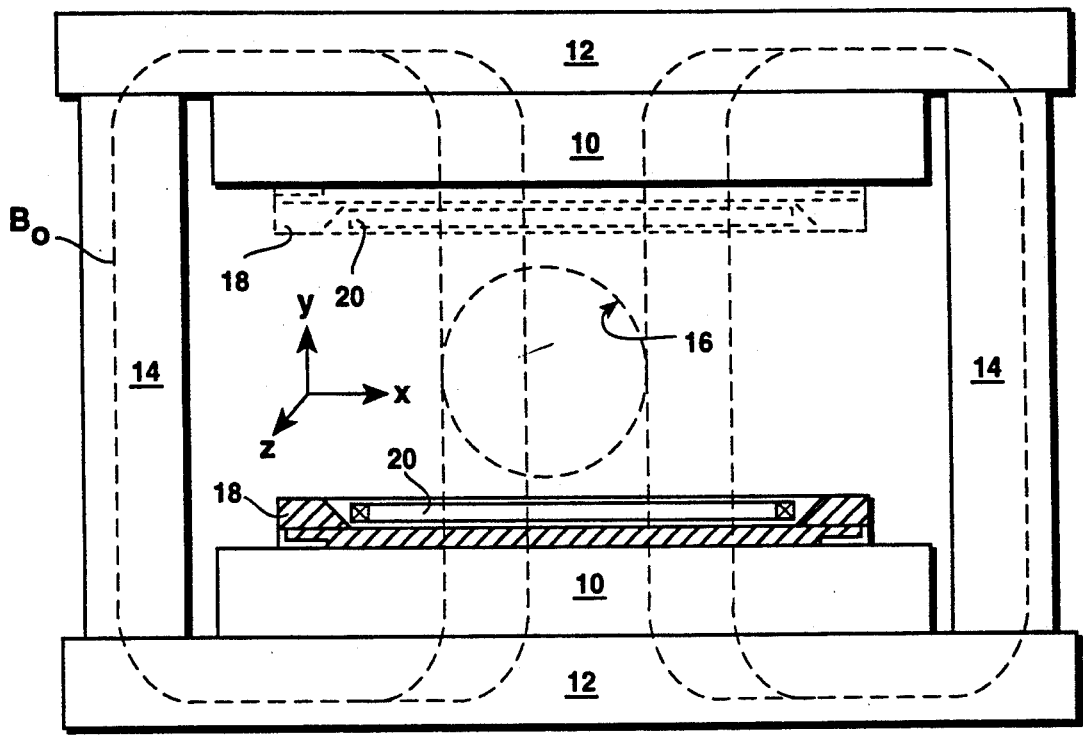
FIG. 1 is a schematic, partially cross-sectioned, side view of a permanent MRI magnet embodying laminated pole pieces in accordance with this invention.

As shown in FIG. 1, a typical permanent static MRI magnet system includes opposing permanent magnet structures 10 interconnected by magnetically permeable yoke structures 12 and 14 so as to define a magnetic circuit which includes imaging region 16 within an air gap between magnets 10. Shaped magnetically permeable pole pieces 18 are included on either side of the image region 16 so as to help maintain a more uniform homogeneous static magnetic field in that region due to magnets 10. Some of the magnetic field lines for the nominally static magnetic field $B_o$ are shown by dotted lines in FIG. 1.

Also shown in FIG. 1 is a schematic depiction of electromagnet gradient coils 20 which are typically disposed proximate pole pieces 18. When suitably supplied with pulsed currents of proper magnitude and timing (conventional source not shown), magnetic gradient coils 20 may introduce a gradient within the static magnetic field $B_o$ (e.g., along x,y, or z coordinate directions as indicated in FIG. 1) within the image region 16. As previously explained, such rapidly changing magnetic flux links to the proximate electrical conductor material included in magnet pole pieces 18 and thereby generates opposing eddy currents—and their attendant opposing magnetic flux. The result is, in effect, a necessary time delay before a desired final level of magnetic gradient can be attained from the onset of a current supply pulse to gradient coils 20.

Figure 2:
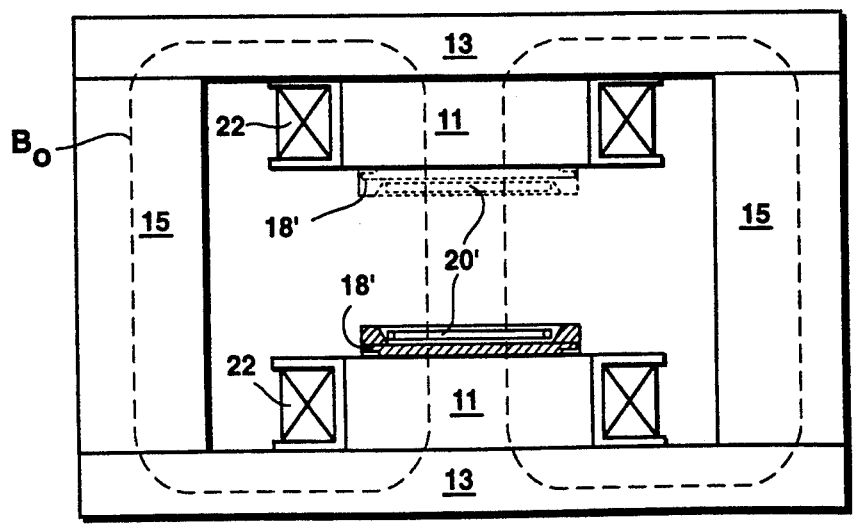
FIG. 2 is a schematic, partially cross-sectioned side view of an embodiment similar to that of FIG. 1 but utilizing an electromagnet field generator.

A similar MRI magnet structure is depicted in FIG. 2 which includes electromagnet coils 22 and iron cores 11 for generating the static magnetic field $B_o$. As will be understood, the magnets may, if desired, also include permanent magnet structures as well. Otherwise, the MRI magnet structure of FIG. 2 may be essentially similar to that of FIG. 1 insofar as this invention is concerned (including magnetically permeable circuit members 13, permanent magnets 15, pole tips 18', gradient coils 20', etc.). As will be appreciated, cryogenic magnets, solenoidal magnets and other members of the magnetic circuit structure may be laminated in accordance with this invention.

Figure 3:
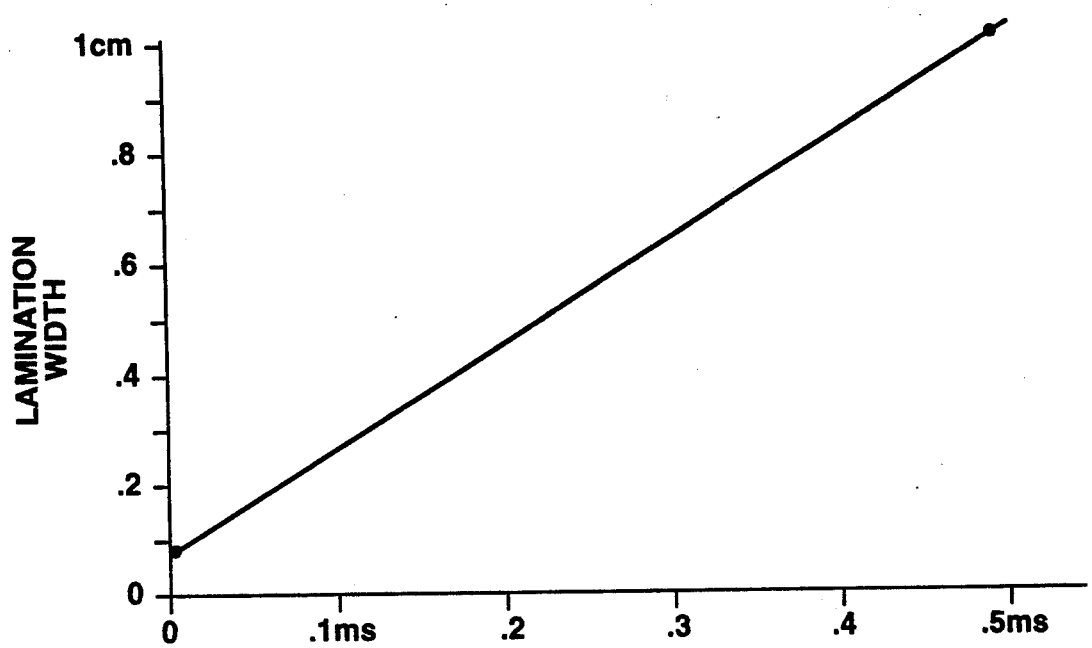
FIG. 3 is a graph schematically depicting the direct relationship between lamination width and pulsed gradient 90% response time limitations caused by eddy currents in MRI magnet pole tips or pole pieces.

As depicted in the schematic graph of FIG. 3, the relative response time from the on-set of a magnetic gradient current pulse (e.g., to achieve 90% of the desired final response), turns out to be directly related to the width of pole piece laminations. In particular, it has been discovered that if one follows the apparent conventional wisdom of having laminations no wider than 0.030 inch (0.7 millimeter), one can achieve 90% response times on the order of 1 microsecond. However, we have discovered that one can achieve 90% response times on the order of 0.5 millisecond with lamination widths on the order of 1 centimeter (i.e., 10 millimeter). Since response times on the order 0.5 millisecond are ample for most MRI imaging sequences insofar as magnetic gradient control is concerned, it follows that one may use considerably wider laminations and still effectively control eddy currents within the laminated pole pieces or tips of a MRI magnet structure. Although the direct relationship may not be exactly linear (as schematically depicted in FIG. 3 for convenience), we have nevertheless discovered that the response time increases as lamination width increases and vice versa.

Figure 4:
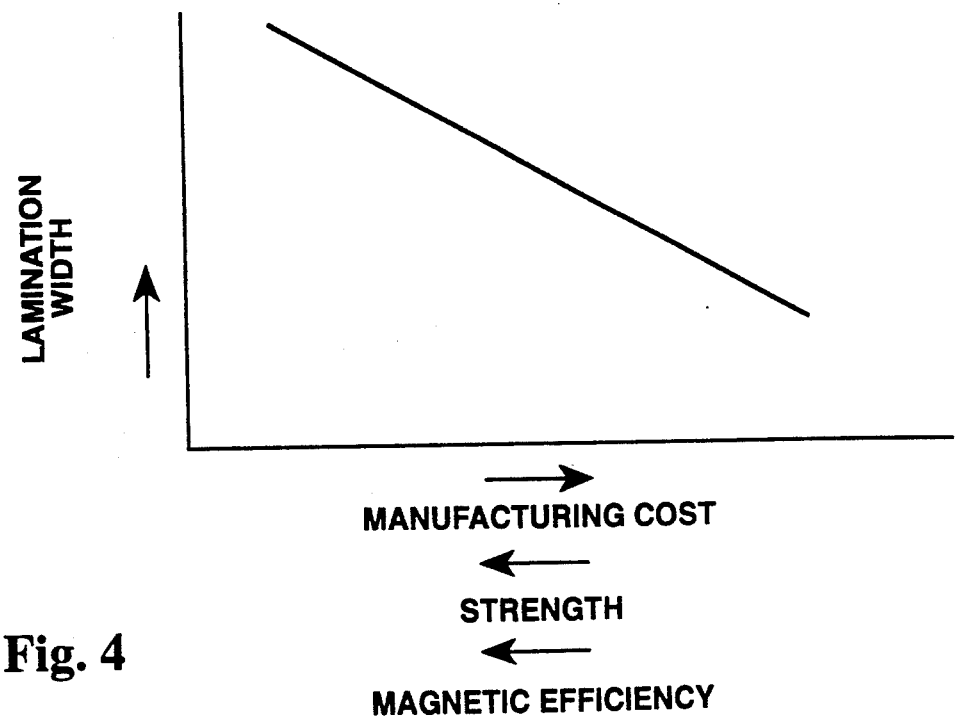
FIG. 4 is a graphical schematic depiction of the inverse relationship between lamination width and manufacturing costs for MRI magnet pole tips or pole pieces (as well as the direct relationship for strength and magnetic efficiency)

At the same time, upon reflection it will be observed (as depicted in FIG. 4) that manufacturing costs are inversely related to lamination width—while mechanical strength and robustness as well as magnetic efficiency are directly related to lamination width.

Accordingly, as we have discovered, by using relatively wide bar-shaped laminations for the pole pieces or tips of a MRI magnet structure, one may advantageously simultaneously reduce manufacturing costs, increase mechanical strength and robustness, increase magnetic efficiency—while also effectively limiting adverse eddy current effects on the timeliness of magnetic gradient pulse operations.

Figure 5:
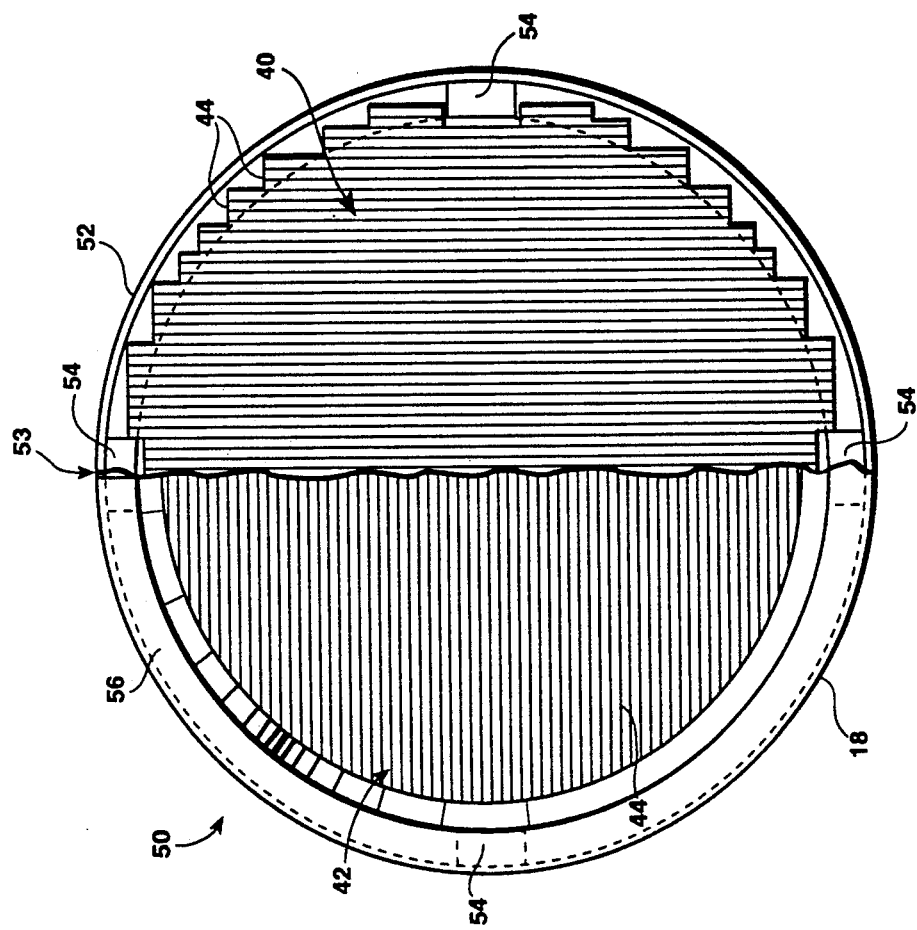
FIG. 5 is a top, partially cut-away, view of MRI magnet pole tips or pole pieces constructed in accordance with an exemplary embodiment of this invention.

In the exemplary embodiment of a laminated pole piece depicted in FIG. 5, two layers 40 and 42 of bar-shaped, relatively wide (e.g., 1 cm), laminations 44 are utilized. As depicted, the laminations 44 in layer 40 are oriented at a angle to the laminations 44 in layer 42 (e.g., preferably 90°).

Figure 6:
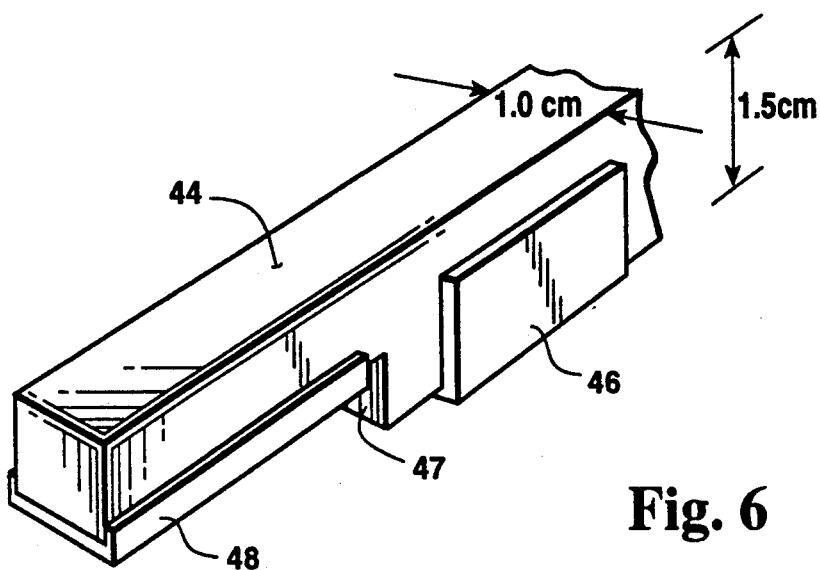
FIG. 6 is a detailed partial perspective view of a notched end of a bar-shaped lamination used in the lower level of the FIG. 5 embodiment.

Since each bar-shaped lamination 44 (see FIG. 6) is approximately 1 centimeter thick only approximately 100 would be needed for a 1 meter diameter pole piece (or only about 150 for a 1.5 meter pole piece as in the preferred exemplary embodiment). Thus, instead of using thousands of relatively thin sheets as in the conventional wisdom approach, a significantly fewer number of laminations are required when using relatively thicker bar-shaped laminations.

Furthermore, by employing adhesive insulating tape pieces 46, 48 at selected locations on at least some of the bar-shaped laminations (e.g., see FIG. 6), uniform rather small spacing between the laminations can be effected easily while arranging the bars in side-by-side arrayed fashion within a layer. For example, they may be conveniently placed within a circular frame 50.

If the lower member 52 of frame 50 has an L-shaped cross-sectional shape (e.g., as shown in FIGS. 7 and 8) and if mating notches 47 are formed in the ends of the bars 44 being arrayed in the lower level 40, then it is relatively easy to insure that the bar members 44 are properly arrayed within the circular frame member 52.

As will appreciated, appropriate spacing between adjacent bar members might be obtained if only every other one of the bar members includes the insulating adhesive tape spacing elements 46, 48. (However, at least one end of each bar member should preferably have an insulating tape piece 48 so as to avoid possible eddy current paths via the bar and the circular frame). It will also be understood throughout this discussion that reference to "lower" or "bottom" or "top" or "upper" or the like, are merely relative position descriptions since the pole tips may be mounted in many different orientations with respect to the earth's surface.

In the exemplary embodiment, solid mounting blocks 54 are located at four equally spaced-apart locations within the L-shaped member 52 so as to receive the upper trapezoidal-shaped cross-section (or possibly rectangular) magnetically permeable upper ring frame member 56. Preferably, threaded bolt connectors 58 clamp together the circular frame members 52 and 56 (the bolt members 58 preferably being electrically isolated from ring frame member 56 such as by insulating washers, or sleeves or the like).

To prevent eddy currents being generated around the periphery of ring frame members 52 and 56, the electrical continuity of at least frame member 56 is preferably interrupted at at least one point 53 around the periphery.

In one exemplary method of manufacture, adhesive insulating tape spacers, such as 46 and 48, are applied to at least some of the bar-shaped laminations 44. The first layer 40 of bar laminations is assembled in side-by-side array (e.g., within circular frame member 52 as depicted at FIG. 7). Then, another layer 42 of the bar laminations is arranged in spaced-apart format on top of the first layer 40. Then, a curable insulating liquid filler (e.g., a synthetic resin such as epoxy resin 60) is poured and flowed into all of the interstices between the laminations of each layer 40 and 42 as well as between each of the laminations 44 within each layer.

Once the liquid filler material cures to its hardened state, the entire mass of bar-shaped laminations becomes mechanically unitary and robust, capable of withstanding large MRI magnetic forces without changing lamination locations and causing corresponding magnetic field aberrations and/or audible noise. The shaped trapezoidal cross-section ring frame member 56 may then be added and bolted in place to finish the construction process.

The static permanent magnet may employ a ferrite magnet, an Alnico magnet or a rare earth Fe-B-R magnet if desired (as in the preferred exemplary embodiment). Light rare earth elements (e.g., Nd and/or Pr) may be employed as the rare earth material R. The bar-shaped laminations may be made from carbon steel, soft iron, pure iron or the like, as desired. In the preferred exemplary embodiment, carbon steel is utilized. The bolt connectors 58 in the preferred exemplary embodiment are made from stainless steel and electrically isolated from the ring frame piece 56. Virtually any commercial grade low-loss epoxy may be used for the insulating filler material 60. The adhesive insulating tape may be any conventional such tape having appropriate thickness for creating a desired interstice spacing between the bar-shaped laminations (e.g., both between layers and between laminations of a given layer). This desired spacing will depend upon the viscosity of the filler material in its liquid form. In the preferred exemplary embodiment, the spacing between bars is approximately 1 millimeter and the adhesive insulating tape used was a fiberglass tape (thus providing a "fill-factor" of about 90% with the exemplary 1 cm thick bars of magnetically permeable material).

Figure 9:
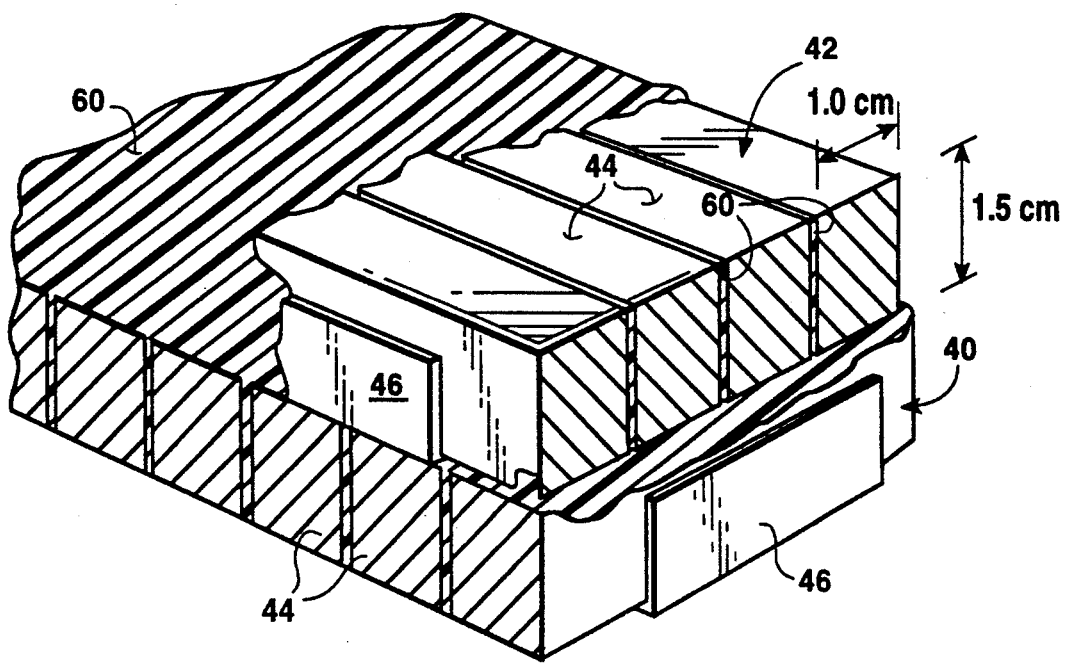
FIG. 9 is a cut-away perspective in cross-section of a central portion of the completed pole tip of FIG. 5.

Although a single lamination layer provides significant attenuation of eddy currents, two layers at 90° orientation are presently preferred since such arrangement provides a more mechanically robust arrangement and may also tend to provide a more isotropic distribution of eddy current effects. A perspective cross-sectional, partially cut-away view of a portion of the central pole piece is shown in FIG. 9. Here, as shown, the adhesive tape pieces 46 and hardened filler evenly separate and mutually insulate the bars 44 while also providing a robust integration of the whole structure.

The ring L-shaped cross-section member 52 may be constructed by assembling, for instance, 4 split submembers in order to facilitate fabrication. This ring frame member preferably is used to help guide the flowing epoxy resin 60 during the flowing step of manufacture. Using this manufacturing technique, one can simultaneously effect insulating of the flat bar-shaped laminations from one another and the inner bonding of all of the laminations one to another.

The adhesive spacing tape may also be a thin polyethylene tape or the like for forming the desired small gaps between bars in the arrayed layers of bars prior to the flowing step of the manufacturing process. Preferably, the gaps between the bar-shaped laminations are made as small as possible (thus minimizing loss of magnetic circuit performance) in view of the filler viscosity during the flowing step of the manufacturing process.

Three or more layers of bar-shaped laminations may, of course, also be employed if desired.

The laminated magnetic circular members or pole pieces are used to concentrate magnetic flux within the air gap defining the MRI image region while maintaining substantially uniform and homogeneous fields therewithin. Accordingly, as is conventional, annular protrusions are formed (e.g., ring frame member 56) on the peripheral portions facing the air gap.

The flat bars may be selected from a variety of bulk material such as carbon steel (which is readily obtainable), other laminate materials and composites of heterogeneous materials. However, if the flat bar stock is too thin, machining may become difficult. Preferably, a bar thickness on the order of 9 to 12 millimeters is used so that the total number of bars in any given layer is only on the order of 100 to 150 (e.g., for an approximately 1 to 1.5 meter diameter pole piece).

If many slits are formed in the ring frame members (to prevent generation of eddy currents thereabout), this in turn tends to create fabrication difficulties. Accordingly, in the preferred embodiment, a single slit 53 is used having a width dimension of about 2 to 4 millimeters. If the bar members are cast in the desired shape (e.g., including proper lengths and notches 47 and the like), finish machining of the bars may be altogether omitted during the manufacturing process if desired.

In the preferred embodiment discussed above, the epoxy resin 60 is flowed into the arrayed bars 44 after their installation within the magnetically permeable ring frame member 52. However, it is also possible that the flowing step is performed after only the first layer (followed of course by a subsequent flowing step when the second layer is in place). Alternatively, the upper ring shaped frame member 56 could also be bolted in place prior to the flowing step. In short, there are a number of possible sequences that could be used for arraying the bar-shaped laminations and ring shaped frame members in conjunction with the flowing of liquid state filler material (which later hardens to a solid state) between the laminations and the frame members.

When both layers 40 and 42 are arrayed before the flowing step, the resulting magnetic pole structure appears to exhibit mechanical strength at least equal to those of prior art pole pieces composed of non-laminated bulk materials. Furthermore, this procedure facilitates the assembly of the MRI magnet structure.

While the time response required for pulse onset to achieve 90% of the desired magnetic gradient field in prior art non-laminated permanent MRI magnets may be as much as 3 to 5 milliseconds, in the exemplary embodiment bar-shaped laminations, a 90% time response of approximately 0.8 milliseconds has been observed.

Although only a few presently preferred exemplary embodiments of this invention have been described in detail, those skilled in the art will recognize that many variations and modifications may be made in these exemplary embodiments while yet retaining many of the novel features and advantages of this invention. Accordingly, all such variations and modifications are intended to be included within the scope of the appended claims.

We claim:

1. An MRI magnet providing an NMR polarizing field $B_o$ within a patient image volume in an air gap between a pair of pole pieces, each pole piece having a laminated magnetic circuit member comprising:

a layer of magnetically permeable bar-shaped laminations bonded together into a unitary structure having a major surface disposed perpendicular to the polarizing field $B_o$ and electrically insulated from each other;

individual ones of said bar-shaped laminations being dimensioned with a length that is perpendicular to said polarizing field $B_o$ and a width in the lamination direction that is greater than 2 millimeters and being spaced sufficiently close to each other as to provide a fill factor of magnetically permeable material substantially in excess of fifty per cent.

2. An MRI magnet as in claim 1 wherein individual ones of said bar-shaped laminations have a width dimension in the lamination direction between 9 millimeters and 12 millimeters and are spaced from other laminations by approximately 1 millimeter or less.

3. An MRI magnet as in claim 1 further comprising:

a second layer of magnetically permeable bar-shaped laminations also bonded together into a unitary structure and electrically insulated from each other with a fill factor of magnetically permeable material substantially in excess of fifty per cent;

individual ones of the bar-shaped laminations in said second layer also being dimensioned with a width in the lamination direction that is greater than 2 millimeters;

said second layer being stacked onto and integrally bonded with the first-mentioned layer while yet electrically insulated therefrom;

the bar-shaped laminations of said second layer being disposed at an angle with respect to the bar-shaped laminations of the first-mentioned layer.

4. An MRI magnet as in claim 1 or 3 wherein encapsulating filler has been positioned into place while in a liquid state between said laminations and thereafter solidified.

5. An MRI magnet as in claim 4 wherein said encapsulating filler is an epoxy resin.

6. An MRI magnet as in claim 1 or 3 including a permanent magnet structure in magnetic circuit with said member.

7. An MRI magnet as in claim 1 or 3 including an electromagnet structure in magnetic circuit with said member to produce, at least in part, a background NMR polarizing magnet field in an MRI system.

8. An MRI magnet as in claim 1 or 3 including a permanent magnet structure and an electromagnet structure in magnetic circuit with said member to produce, at least in part, a background NMR polarizing magnet field in an MRI system.

9. An MRI magnet having a laminated magnetic circuit member comprising:
   a layer of magnetically permeable bar-shaped laminations bonded together into a unitary structure and electrically insulated from each other;
   individual ones of said bar-shaped laminations being dimensioned with a width in the lamination direction that is greater than 2 millimeters,
   wherein said member is of circular shape approximately 1 meter or more in diameter and a pair of such members are oppositely disposed on opposite sides of an imaging region, there being less than 500 individual bar-shaped laminations in a member layer.

10. An MRI magnet as in claim 9 wherein there are fewer than 200 individual bar-shaped laminations in a member layer.

11. An MRI magnet as in claim 10 wherein the number of individuals bar-shaped laminations in a member layer is in the range of 100 to 150.

12. An MRI magnet having a laminated magnetic circuit member comprising:
   a layer of magnetically permeable bar-shaped laminations bonded together into a unitary structure and electrically insulated from each other;
   individual ones of said bar-shaped laminations being dimensioned with a width in the lamination direction that is greater than 2 millimeters,
   a second layer of magnetically permeable bar-shaped laminations also bonded together into a unitary structure and electrically insulated from each other;
   individual ones of the bar-shaped laminations in said second layer also being dimensioned with a width of the lamination direction that is greater than 2 millimeters;
   said second layer being stacked onto and integrally bonded with the first-mentioned layer while yet electrically insulated therefrom;
   the bar-shaped laminations of said second layer being disposed at an angle with respect to the bar-shaped laminations of the first-mentioned layer,
   wherein said angle is approximately 90 degrees.

13. An MRI magnet having a laminated magnetic circuit member comprising:
   a layer of magnetically permeable bar-shaped laminations bonded together into a unitary structure and electrically insulated from each other;
   individual ones of said bar-shaped laminations being dimensioned with a width in the lamination direction that is greater than 2 millimeters,
   wherein said member includes a first circular magnetically permeable frame member mounted on said bar-shaped laminations and a second circular magnetically permeable frame member circumscribing said bar-shaped laminations.

14. An MRI magnet as in claim 13 wherein said second circular frame member includes an inner recess therein, the bar-shaped laminations of one layer having notched ends located within said inner recess of the second frame member;
   said first frame member being mounted in registry with the second circular frame member and sandwiching the ends of said bar-shaped laminations between the circular frame members.

15. An MRI magnet as in claim 13 wherein the first frame member includes at least one interruption in electrical continuity.

16. An MRI magnet as in claim 13 wherein the first frame member includes a trapezoidal or rectangular cross-section.

17. An MRI magnet as in claim 13 wherein the second frame member includes an L-shaped cross-section.

18. An MRI magnet as in claim 14 further comprising a plurality of circumferentially spaced-apart mounting blocks disposed within the open area of said second frame member for support of said first frame member.

19. An MRI magnet as in claim 14 further comprising threaded bolt connections extending between said first and second circular frame members while remaining electrically isolated from at least one of said frame members.

20. An MRI magnet having a laminated magnetic circuit member comprising:
   a layer of magnetically permeable bar-shaped laminations bonded together into a unitary structure and electrically insulated from each other;
   individual ones of said bar-shaped laminations being dimensioned with a width in the lamination direction that is greater than 2 millimeters,
   including electrically insulating tape disposed at predetermined positions on said bar-shaped laminations and defining spaces into which an insulating filler is located.

21. An MRI magnet as in claim 20 wherein the spaces between bar-shaped laminations into which filler is located are approximately 1 mm in the lamination direction.

22. An MRI magnet having a laminated magnetic circuit member comprising:
   a layer of magnetically permeable bar-shaped laminations bonded together into a unitary structure and electrically insulated from each other;
   individual ones of said bar-shaped laminations being dimensioned with a width in the lamination direction that is greater than 2 millimeters,
   wherein the bar-shaped laminations have cross-sectional dimensions of approximately 10 millimeters thickness in the lamination direction and approximately 15 millimeters in height.

23. A laminated magnetic circuit member for use with an MRI magnet in proximity to pulsed magnetic gradient coils, said magnet providing an NMR polarizing field $B_o$ within a patient image volume in an air gap between a pair of pole pieces, each pole piece having a laminated magnetic circuit member, said laminated magnetic circuit member comprising:

a layer of magnetically permeable bar-shaped laminations bonded together into a unitary structure having a major surface disposed perpendicular to the polarizing field $B_O$ and electrically insulated from each other;

individual ones of said bar-shaped lamination being dimensioned with a length that is perpendicular to said polarizing field $B_o$ and a width in the lamination direction that is greater than 2 millimeters and being spaced sufficiently close to each other as to provide a fill factor of magnetically permeable material substantially in excess of fifty per cent.

24. A laminated magnetic circuit member as in claim 23 wherein individual ones of said bar-shaped laminations have a width dimension in the lamination direction between 9 millimeters and 12 millimeters and are spaced from other laminations by approximately 1 millimeter or less.

25. A laminated magnetic circuit member as in claim 23 further comprising:

a second layer of magnetically permeable bar-shaped laminations also bonded together into a unitary structure and electrically insulated from each other with a fill factor of magnetically permeable material substantially in excess of fifty per cent;

individual ones of the bar-shaped laminations in said second layer also being dimensioned with a width in the lamination direction that is greater than 2 millimeters;

said second layer being stacked onto and integrally bonded with the first-mentioned layer while yet electrically insulated therefrom;

the bar-shaped laminations of said second layer being disposed at an angle with respect to the bar-shaped laminations of the first-mentioned layer.

26. A laminated magnetic circuit member as in claim 23 or 25 wherein encapsulating filler has been positioned into place between said laminations while in a liquid state and thereafter solidified.

27. A laminated magnetic circuit member as in claim 26 wherein said encapsulating filler is an epoxy resin.

28. A laminated magnetic circuit member for use with an MRI magnet in proximity to pulsed magnetic gradient coils, said laminated magnetic circuit member comprising:

a layer of magnetically permeable bar-shaped laminations bonded together into a unitary structure and electrically insulated from each other;

individual ones of said bar-shaped laminations being dimensioned with a width in the lamination direction that is greater than 2 millimeters, wherein said pole member is of circular shape approximately 1 meter or more in diameter, there being less than 500 individual bar-shaped laminations in a pole member layer.

29. A laminated magnetic circuit member as in claim 28 wherein there are fewer than 200 individual bar-shaped laminations in a pole member layer.

30. A laminated magnetic circuit member as in claim 29 wherein the number of individual bar-shaped laminations in a member layer is in the range of 100 to 150.

31. A laminated magnetic circuit member for use with an MRI magnet in proximity to pulsed magnetic gradient coils, said laminated magnetic circuit member comprising:

a layer of magnetically permeable bar-shaped laminations bonded together into a unitary structure and electrically insulated from each other;

individual ones of said bar-shaped laminations being dimensioned with a width in the lamination direction that is greater than 2 millimeters, a second layer of magnetically permeable bar-shaped laminations also bonded together into a unitary structure and electrically insulated from each other;

individual ones of the bar-shaped laminations in said second layer also being dimensioned with a width in the lamination direction that is greater than 2 millimeters;

said second layer being stacked onto and integrally bonded with the first-mentioned layer while yet electrically insulated therefrom;

the bar-shaped laminations of said second layer being disposed at an angle with respect to the bar-shaped laminations of the first-mentioned layer, wherein said angle is approximately 90 degrees.

32. A laminated magnetic circuit member for use with an MRI magnet in proximity to pulsed magnetic gradient coils, said laminated magnetic circuit member comprising:

a layer of magnetically permeable bar-shaped laminations bonded together into a unitary structure and electrically insulated from each other;

individual ones of said bar-shaped laminations being dimensioned with a width in the lamination direction that is greater than 2 millimeters, wherein said member includes a first circular magnetically permeable frame member mounted on said bar-shaped laminations and a second circular magnetically permeable frame member circumscribing said bar-shaped laminations.

33. A laminated magnetic circuit member as in claim 32 wherein:

said second circular frame member includes an inner recess therein, the bar-shaped laminations of one layer having notched ends located within said inner recess of the second frame member;

said first circular frame member being mounted in registry with the second circular frame member and sandwiching the ends of said bar-shaped laminations between the circular frame members.

34. A laminated magnetic circuit member as in claim 32 wherein the first frame member includes at least one interruption in electrical continuity.

35. A laminated magnetic circuit as in claim 32 wherein the first frame member includes a trapezoidal or rectangular cross-section.

36. A laminated magnetic circuit member as in claim 32 wherein the second frame member includes an L-shaped cross-section.

37. A laminated magnetic circuit member as in claim 33 further comprising a plurality of circumferentially spaced-apart mounting blocks disposed within the open area of said second frame member for support of said first frame member.

38. A laminated magnetic circuit member as in claim 33 further comprising threaded bolt connections extending between said first and second circular frame members while remaining electrically isolated from at least one of said frame members.

39. A laminated magnetic circuit member for use with an MRI magnet in proximity to pulsed magnetic gradient coils, said laminated magnetic circuit member comprising:
- a layer of magnetically permeable bar-shaped laminations bonded together into a unitary structure and electrically insulated from each other;
- individual ones of said bar-shaped laminations being dimensioned with a width in the lamination direction that is greater than 2 millimeters,
- including electrically insulating tape disposed at predetermined positions on said bar-shaped laminations and defining spaces into which an insulating filler is located.

40. A laminated magnetic circuit member as in claim 39 further the spaces between bar-shaped laminations into which filler is located are approximately 1 mm in the lamination dimension.

41. A laminated magnetic circuit member for use with an MRI magnet in proximity to pulsed magnetic gradient coils, said laminated magnetic circuit member comprising:
- a layer of magnetically permeable bar-shaped laminations bonded together into a unitary structure and electrically insulated from each other;
- individual ones of said bar-shaped laminations being dimensioned with a width in the lamination direction that is greater than 2 millimeters,
- wherein the bar-shaped laminations have cross-sectional dimensions of approximately 10 millimeters thickness in the lamination direction and approximately 15 millimeters in height.

42. An MRI magnet having a laminated magnetic circuit member comprising:
- a layer of magnetically permeable bar-shaped laminations bonded together into a unitary structure and electrically insulated from each other;
- individual ones of said bar-shaped laminations being dimensioned with a width in the lamination direction that is greater than 2 millimeters,
- a second layer of magnetically permeable bar-shaped laminations also bonded together into a unitary structure and electrically insulated from each other;
- individual ones of the bar-shaped laminations in said second layer also being dimensioned with a width in the lamination direction that is greater than 2 millimeters;
- said second layer being stacked onto and integrally bonded with the first-mentioned layer while yet electrically insulated therefrom;
- the bar-shaped laminations of said second layer being disposed at an angle with respect to the bar-shaped laminations of the first-mentioned layer,
- wherein said member includes a first circular magnetically permeable frame member mounted on said bar-shaped laminations and a second circular magnetically permeable frame member circumscribing said bar-shaped laminations.

43. An MRI magnet as in claim 42 wherein said second circular frame member includes an inner recess therein, the bar-shaped laminations of one layer having notched ends located within said inner recess of the second frame member;
- said first frame member being mounted in registry with the second circular frame member and sandwiching the ends of said bar-shaped laminations between the circular frame members.

44. An MRI magnet as in claim 42 wherein the first frame member includes at least one interruption in electrical continuity.

45. An MRI magnet as in claim 42 wherein the first frame member includes a trapezoidal or rectangular cross-section.

46. An MRI magnet as in claim 42 wherein the second frame member includes an L-shaped cross-section.

47. An MRI magnet as in claim 43 further comprising a plurality of circumferentially spaced-apart mounting blocks disposed within the open area of said second frame member for support of said first frame member.

48. An MRI magnet as in claim 43 further comprising threaded bolt connections extending between said first and second circular frame members while remaining electrically isolated from at least one of said frame members.

49. An MRI magnet having a laminated magnetic circuit member comprising:
- a layer of magnetically permeable bar-shaped laminations bonded together into a unitary structure and electrically insulated from each other;
- individual ones of said bar-shaped laminations being dimensioned with a width in the lamination direction that is greater than 2 millimeters,
- a second layer of magnetically permeable bar-shaped laminations also bonded together into a unitary structure and electrically insulated from each other;
- individual ones of the bar-shaped laminations in said second layer also being dimensioned with a width in the lamination direction that is greater than 2 millimeters;
- said second layer being stacked onto and integrally bonded with the first-mentioned layer while yet electrically insulated therefrom;
- the bar-shaped laminations of said second layer being disposed at an angle with respect to the bar-shaped laminations of the first-mentioned layer,
- including electrically insulating tape disposed at predetermined positions on said bar-shaped laminations and defining spaces into which an insulating filler is located.

50. An MRI magnet as in claim 49 wherein the spaces between bar-shaped laminations into which filler is located are approximately 1 mm in the lamination dimension.

51. An MRI magnet having a laminated magnetic circuit member comprising:
- a layer of magnetically permeable bar-shaped laminations bonded together into a unitary structure and electrically insulated from each other;
- individual ones of said bar-shaped laminations being dimensioned with a width in the lamination direction that is greater than 2 millimeters,
- a second layer of magnetically permeable bar-shaped laminations also bonded together into a unitary structure and electrically insulated from each other;
- individual ones of the bar-shaped laminations in said second layer also being dimensioned with a width in the lamination direction that is greater than 2 millimeters;
- said second layer being stacked onto and integrally bonded with the first-mentioned layer while yet electrically insulated therefrom;

the bar-shaped laminations of said second layer being disposed at an angle with respect to the bar-shaped laminations of the first-mentioned layer, wherein said member includes a first circular magnetically permeable frame member mounted on said bar-shaped laminations and a second circular magnetically permeable frame member circumscribing said bar-shaped laminations.

52. A laminated magnetic circuit member as in claim 51 wherein:

said second circular frame member includes an inner recess therein, the bar-shaped laminations of one layer having notched ends located within said inner recess of the second frame member;

said first circular frame member being mounted in registry with the second circular frame member and sandwiching the ends of said bar-shaped laminations between the circular frame members.

53. A laminated magnetic circuit member as in claim 51 wherein the first frame member includes at least one interruption in electrical continuity.

54. A laminated magnetic circuit as in claim 51 wherein the first frame member includes a trapezoidal or rectangular cross-section.

55. A laminated magnetic circuit member as in claim 51 wherein the second frame includes an L-shaped cross-section.

56. A laminated magnetic circuit member as in claim 52 further comprising a plurality of circumferentially spaced-apart mounting blocks disposed within the open area of said second frame member for support of said first frame member.

57. A laminated magnetic circuit member as in claim 52 further comprising threaded bolt connections extending between said first and second circular frame members while remaining electrically isolated from at least one of said frame members.

58. A laminated magnetic circuit member for use with an MRI magnet in proximity to pulsed magnetic gradient coils, said laminated magnetic circuit member comprising:

a layer of magnetically permeable bar-shaped laminations bonded together into a unitary structure and electrically insulated from each other;

individual ones of said bar-shaped laminations being dimensioned with a width in the lamination direction that is greater than 2 millimeters;

a second layer of magnetically permeable bar-shaped laminations also bonded together into a unitary structure and electrically insulated from each other;

individual ones of the bar-shaped laminations in said second layer also being dimensioned with a width in the lamination direction that is greater than 2 millimeters;

said second layer being stacked onto and integrally bonded with the first-mentioned layer while yet electrically insulated therefrom;

including electrically insulating tape disposed at predetermined positions on said bar-shaped laminations and defining spaces into which an insulating filler is located.

59. A laminated magnetic circuit member as in claim 58 wherein the spaces between bar-shaped laminations into which filler is located are approximately 1 mm in the lamination dimension.

60. A laminated magnetic circuit member for use with an MRI magnet in proximity to pulsed magnetic gradient coils, said laminated magnetic circuit member comprising:

a layer of magnetically permeable bar-shaped laminations bonded together into a unitary structure and electrically insulated from each other;

individual ones of said bar-shaped laminations being dimensioned with a width in the lamination direction that is greater than 2 millimeters, the bar-shaped laminations of said second layer being disposed at an angle with respect to the bar-shaped laminations of the first-mentioned layer, a second layer of magnetically permeable bar-shaped laminations also bonded together into a unitary structure and electrically insulated from each other;

individual ones of the bar-shaped laminations in said second layer also being dimensioned with a width in the lamination direction that is greater than 2 millimeters;

said second layer being stacked onto and integrally bonded with the first-mentioned layer while yet electrically insulated therefrom;

the bar-shaped laminations of said second layer being disposed at an angle with respect to the bar-shaped laminations of the first-mentioned layer, wherein the bar-shaped laminations have cross-sectional dimensions of approximately 10 millimeters thickness in the lamination direction and approximately 15 millimeters in height.

* * * * *